United States Patent [19]

Sato et al.

[11] Patent Number: 4,654,553

[45] **Date of Patent: * Mar. 31, 1987**

[54] RELAY WITH ACTUATOR WHICH ACTUATES BISTABLE SWITCHING MECHANISM

[75] Inventors: Ryuichi Sato; Tsutomu Taniguchi, both of Kyoto; Masatoshi Ohba, Nagaokakyo, all of Japan

[73] Assignee: Omron Tateisi Electronics Co., Kyoto, Japan

[ * ] Notice: The portion of the term of this patent subsequent to Feb. 4, 2003 has been disclaimed.

[21] Appl. No.: 777,764

[22] Filed: Sep. 19, 1985

[30] Foreign Application Priority Data

Sep. 20, 1984 [JP] Japan ................................ 59-197944

[51] Int. Cl.⁴ ................................................ H01L 41/08

[52] U.S. Cl. ..................................... 310/316; 310/317; 310/332; 200/181

[58] Field of Search ................................ 310/330–332, 310/328, 317, 316; 200/181

[56] References Cited

U.S. PATENT DOCUMENTS

| | | | |
|---|---|---|---|
| 2,800,551 | 7/1957 | Crownover | 310/331 X |
| 2,835,761 | 5/1958 | Crownover | 310/331 X |
| 2,867,701 | 1/1959 | Thurston | 310/330 X |
| 2,916,578 | 12/1959 | Crownover | 200/87 |
| 3,292,111 | 12/1966 | Cotton | 335/3 |
| 4,237,399 | 12/1980 | Sakamoto | 310/332 X |
| 4,383,195 | 5/1983 | Kolm et al. | 310/332 X |
| 4,395,651 | 7/1983 | Yamamoto | 310/331 X |
| 4,533,849 | 8/1985 | Schnell | 310/331 X |
| 4,568,849 | 2/1986 | Sato et al. | 310/332 X |

*Primary Examiner*—Mark O. Budd

*Attorney, Agent, or Firm*—Wegner & Bretschneider

[57] ABSTRACT

This relay has an actuator which has a pair of coupled together driving elements, of a type which deflects according to applied voltage. The actuator deflects in one direction when voltage is applied to one driving element and deflects in another direction when voltage is applied to the other driving element. A bistable switching mechanism has an actuating member and a set of contacts. These contacts are flipped over to a first state when the actuating member is impelled in a first direction and thereafter stay stably in the first state until the actuating member is impelled in a second direction, and similarly are flipped over to a second state when the actuating member is impelled in the second direction and stay stably in the second state until the actuating member is impelled in the first direction. A drive circuit upon command supplies a one shot pulse of relatively short duration to either the one or the other of the driving elements. The actuator is coupled to the actuating member of the bistable switching mechanism, so as when deflecting in the one direction to impel the actuating member in the first direction, and when deflecting in the another direction to impel the actuating member in the second direction. Optionally, the coupling between the actuator and the actuating member of the bistable switching mechanism may have a certain amount of play provided in it, and the driving elements of the actuator may be piezoelectric elements.

5 Claims, 9 Drawing Figures

RELAY WITH ACTUATOR WHICH ACTUATES BISTABLE SWITCHING MECHANISM

BACKGROUND OF THE INVENTION

The present invention relates to the field of relays, and in particular to a low power consumption relay which includes an actuator formed from piezoelectric elements which undergo displacement according to applied voltage.

Relays whose motive power is provided by electromagnetic coils are per se well known. Recently, the concept of using a piezoelectric element as the actuating member for a relay, instead of an electromagnetic coil, has been mooted. However, the following problem related to hysteresis has arisen. In FIG. 8 of the accompanying drawings, there is shown a typical characteristic of such a piezoelectric element with regard to the strain produced in it by applied voltage. If such an element is used as the actuator for a relay, then in a typical operational cycle, from the point O where no voltage is applied thereto, first an initial actuating voltage V1 is applied thereto to bring the operational condition and the strain to be as indicated by the point P1, and then the applied voltage is raised to the voltage V2 to bring the operational condition to the point P2. This causes the actuator to be displaced by the amount S2 from its original position, which is effective for switching over the contacts of the relay to their actuated position, as desired. However, if the application of this voltage V2 is continued for a considerable time, which is a condition that must be reckoned with, then the displacement of the piezoelectric element will increase from the amount S2 to a larger amount S4, so as to bring the operational condition to the point P4 in the diagram. If thereafter the applied voltage is reduced back to zero, the system transits to the operational condition indicated by the point P5, and it may well be the case that the displacement S5 corresponding to this zero voltage point P5 does not reach as low as the amount of displacement S3 at the point P3 at which the contacts of the relay are restored to their original or restored condition. In such a case, the contacts of the relay are not properly switched in the restoring direction, and the relay does not function properly. Thus, this hysteresis effect can interfere with proper operation of the relay.

SUMMARY OF THE INVENTION

Accordingly, it is the primary object of the present invention to provide a relay utilizing an actuator including elements like piezoelectric elements, which overcomes the above outlined problems.

It is a further object of the present invention to provide such a relay utilizing an actuator including such elements, which is not troubled by problems of hysteresis.

It is a further object of the present invention to provide such a relay utilizing an actuator including such elements, which can be reliably counted upon to restore properly when actuating voltage is removed.

It is a further object of the present invention to provide such a relay utilizing an actuator including such elements, which is reliable for restoration action, even if the actuating voltage supplied thereto has been maintained for a considerable time.

It is a further object of the present invention to provide such a relay utilizing an actuator including such elements, which has stabilized action.

It is a further object of the present invention to provide such a relay utilizing an actuator including such elements, which has a low power consumption.

It is a further object of the present invention to provide such a relay utilizing an actuator including such elements, which is economical.

It is a further object of the present invention to provide such a relay utilizing an actuator including such elements, which is durable over a long service lifetime.

According to the most general aspect of the present invention, these and other objects are accomplished by a relay comprising: (a) an actuator, comprising a pair of driving elements of a type which deflects according to applied voltage which are coupled together, said actuator deflecting in one direction when voltage is applied to the one of said driving elements and deflecting in another direction when voltage is applied to the other of said driving elements; (b) a bistable switching mechanism comprising an actuating member and a set of contacts, said set of contacts being flipped over to a first state when said actuating member is impelled in a first direction and thereafter staying stably in said first state until said actuating member is impelled in a second direction, and being flipped over to a second state when said actuating member is impelled in said second direction and staying stably in said second state until said actuating member is impelled in said first direction; and: (c) a drive circuit which upon command supplies a one shot pulse of relatively short duration to either said one of said driving elements or the other of said driving elements; (d) said actuator being coupled to said actuating member of said bistable switching mechanism, so as when deflecting in said one direction to impel said actuating member in said first direction, and when deflecting in said another direction to impel said actuating member in said second direction.

According to such a structure, since voltage is applied to the one or the other of said driving elements by the drive circuit only when the relay is to be switched over, the actuator is not affected by any substantial hysteresis effect, since it is not maintained as exerting its force for any very considerable time. Accordingly, the actuator undergoes action between the activation point and the restoration point without causing any improper effects. Furthermore, as compared to a conventional electromagnetic relay, power consumption is drastically reduced, and a low power consumption relay is provided, thereby achieving the object of this invention and producing a notable effect. Thus, this actuator including such elements which may preferably be piezoelectric elements can be reliably counted upon to restore properly when actuating voltage is removed, even if the actuating voltage supplied thereto has been maintained for a considerable time. Thus, this relay has stabilized action and is durable over a long service lifetime. As a further specialization, the coupling between said actuator and said actuating member of said bistable switching mechanism may have a certain amount of play provided in it, and this further aids with the non hysteresis operation of the relay, as will be explained in the following.

BRIEF DESCRIPTION OF THE DRAWING

The present invention will now be shown and described with reference to the preferred embodiments thereof, and with reference to the illustrative drawings. It should be clearly understood, however, that the description of the embodiments, and the drawings, are all of them given purely for the purposes of explanation and exemplification only, and are none of them intended to be limitative of the scope of the present invention in any way, since the scope of the present invention is to be defined solely by the legitimate and proper scope of the appended claims. In the drawings, like parts and spaces and so on are denoted by like reference symbols in the various figures thereof; in the description, spatial terms are to be everywhere understood in terms of the relevant figure; and:

DESCRIPTION OF THE PREFERRED EMBODIMENTS

Figure 1:
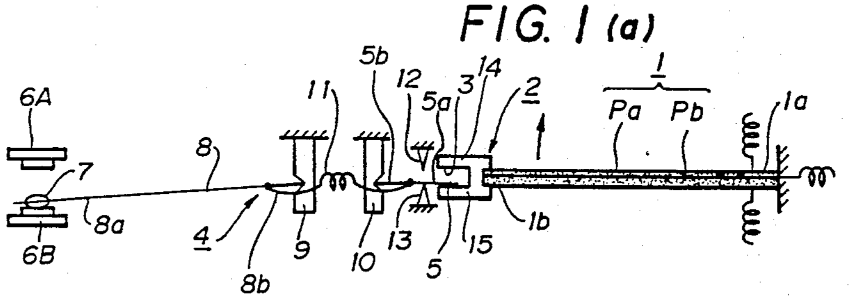
FIG. 1 is a schematic diagram showing the general structure of the first preferred embodiment of the relay of the present invention, and particularly in FIG. 1*a* showing said structure in its restored position and in FIG. 1*b* showing said structure in its actuated position.
Figure 1:
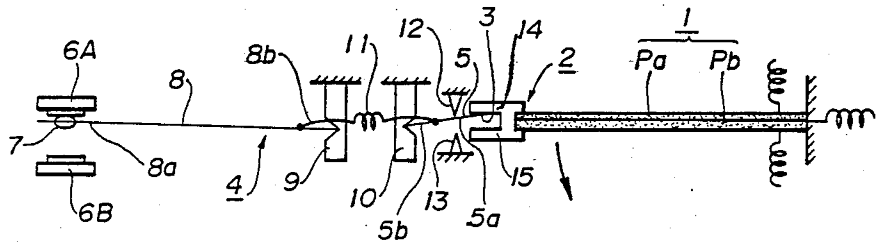

The present invention will now be described with reference to the preferred embodiments thereof, and with reference to the appended drawings. FIG. 1 shows the general structure of the first preferred embodiment of the relay of this invention in schematic form, and FIG. 1*a* shows the relay in its restored state, while FIG. 1*b* shows the relay in its actuated state. This relay comprises an actuator 1 which is formed as a sandwich of a superposed pair of planar actuating plates Pa and Pb which are elements such as piezoelectric elements which undergo displacement according to the magnitude of the voltage applied thereto (hereinafter referred to simply as piezoelectric elements). The base end 1*a* of this actuator 1 is fixedly secured to a base not shown in the figure, while the tip end 1*b* thereof is fitted into a fitting groove formed on an actuating member 2, thus mounting said actuating member 2 to the end of the actuator 1. This actuating member 2 is formed with a pair of actuating projections 14 and 15, between which is defined an engagement groove 3 into which the one end 5*a* of a flip over lever 5 is fitted. The width of this engagement groove 3 will be denoted by the symbol "D" and will be discussed later.

The flip over lever 5 is comprised in and functions as the actuating member of a bistable switching mechanism 4, the construction of which in this first preferred embodiment will now be described. This bistable switching mechanism 4 further comprises a movable contact 7 which is mounted at a one end 8*a* of a movable contact support member 8 and is supported between two fixed contacts 6A and 6B. The other end 8*b* of said movable contact support member 8 is pivotably supported in a V shaped groove formed in a support member 9 therefor, and similarly the other end 5*b* of the flip over lever 5 is pivotably supported in a V shaped groove formed in another support member 10. And a tension coil spring 11 joins a point intermediate along said movable contact support member 8 to a point intermediate along said flip over lever 5 and biases them towards one another with a certain biasing spring force (also in this construction optionally holding said movable contact support member 8 and said flip over lever 5 in their respective V grooves). Stops 12 and 13 are provided for limiting the rotational movement of the flip over lever 5; the rotational movement of the movable contact support member 8 is of course limited by the fixed contacts 6A and 6B.

Thus, as will be easily understood by one of ordinary skill in the relevant art based upon the above descriptions, the bistable switching mechanism 4 functions as an over center flip flop device, and the movable contact 7 can be switched over between the two fixed contacts 6A and 6B by pushing upwards or downwards in the figures on the end 5*a* of the flip over lever 5. And, in either of the two stable positions of this flip flop device as shown in FIGS. 1*a* and 1*b*, said movable contact 7 is firmly pressed against one of these fixed contacts 6A and 6B while being securely removed away from the other one thereof. In other words, when the end 5*a* of the flip over lever 5 is displaced in the downwards direction in the figures past a certain over center region (roughly but not exactly corresponding to a straight line configuration of the parts), then the action of the tension coil spring 11 which moves over said over center region pulls the movable contact support member 8 so as to make it rotate in the counterclockwise direction in the figure, so as to bring the movable contact 7 to be firmly pressed against the fixed contact 6B while being securely removed away from the other fixed contact 6A, and so the relay is brought to be in its restored state as shown in FIG. 1*a*. On the other hand, when the end 5*a* of the flip over lever 5 is displaced in the upwards direction in the figures past said certain over center region, then the action of the tension coil spring 11 which moves over said over center region now pulls the movable contact support member 8 so as to make it rotate in the clockwise direction in the figure, so as now to bring the movable contact 7 to be firmly pressed against the fixed contact 6A while being securely removed away from the other fixed contact 6B, and so the relay is brought to be in its actuated state as shown in FIG. 1*b*.

Thus, considering the action as starting when the relay is in its restored state as shown in FIG. 1*a*, when in this condition an appropriate voltage is applied to the one Pa of the piezoelectric plate elements making up the actuator 1, said actuator 1 bends in the direction as indicated in FIG. 1*a* by the arrow, i.e. in the upwards direction, and the projecting portion 15 of the actuating member 2 fitted thereon pushes on the end 5*a* of the flip over lever 5, to push it upwards in the figure so as to switch over the bistable switching mechanism 4 as just explained to its actuated position as shown in FIG. 1*b*. On the other hand, when the relay is in this actuated state as shown in FIG. 1*b*, and when an appropriate voltage is applied to the other one Pb of the piezoelectric plate elements making up the actuator 1, said actuator 1 bends in the direction as indicated in FIG. 1*b* by the arrow, i.e. in the downwards direction, and the other projecting portion 14 of the actuating member 2 pushes on the end 5*a* of the flip over lever 5, to push it downwards in the figure so as switch over the bistable switching mechanism 4 as just explained back to its restored position as shown in FIG. 1*a*.

Figure 8:
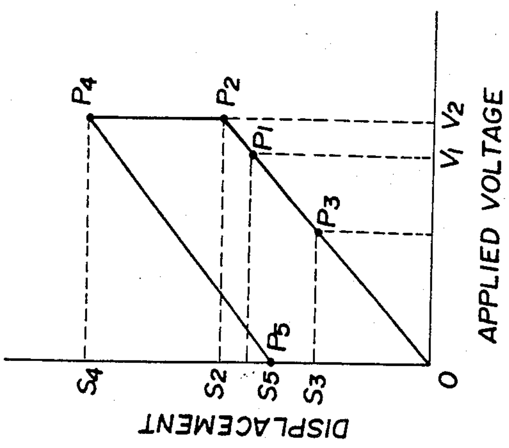
FIG. 8 is a graph showing the strain property of a piezoelectric element against the voltage applied thereto, and is primarily applicable to the prior art although having some reference to the present invention.

Particularly according to a particular aspect of the present invention, the width D of the engagement groove 3 formed in the actuating member 2 is made to be considerably wider than the thickness of the end 5*a* of the flip over lever 5 fitted into said engagement groove 3 upon which said actuating member 2 acts. This is done to provide some play, so that it is possible to actuate the piezoelectric plate elements Pa and Pb which make up the actuator 1 by so called one shot pulses of voltage. In other words, when it is required to switch over the relay, then a one shot pulse of voltage is supplied (from a drive circuit of a type which will be explained later) to the appropriate one of the piezoelectric plate elements Pa and Pb, but no voltage is supplied to either of these piezoelectric plate elements Pa and Pb for holding the relay in either of its switched states. Thus the bending of the actuator 1 described above, effective for switching over the relay, is not maintained for any particular length of time after the relay has switched over, but is fairly quickly ceased. This is suggested in FIGS. 1*a* and 1*b*. Because of the above described play in the engagement of the end 5*a* of the flip over lever 5 to the engagement groove 3 of the actuating member 2, and because of the flip flop action of the bistable switching mechanism 4, this does not cause switching back of the relay. Thus, since neither of the piezoelectric plate elements Pa and Pb is ever supplied with actuating voltage for any considerable length of time, the operation of the actuator 1 is free from the ill effects of hysteresis described earlier in the portion of this specification entitled "Background of the Invention" and present in the prior art. Thereby, referring to the diagram of FIG. 8 insofar as it relates to the operation of the present invention, the operation point moves to and fro between the point P2 and the Point O in a stable manner.

As a guide for forming the width D of the engagement groove 3, if the displacement of the flip over lever 5 between its two stable positions is S and a width margin for taking account of the wear of the contacts is desirably alpha, then d should=S+2*alpha.

And, if the flip over point or the dead center point of the flip over lever 5 is at its mid stroke, i.e. at displacement S/2, which is presumably and usually the case, then the displacement delta of the actuator 1 is required to be greater than or equal to S/2+alpha. Thus, the flip over lever 5, if in the position of contact on the inner side of either one of the actuating projections 14 and 15, is in the stable switched over state as shown in the relevant one of the FIGS. 1*a* and 1*b*, ready for the next switching action.

Figure 2:
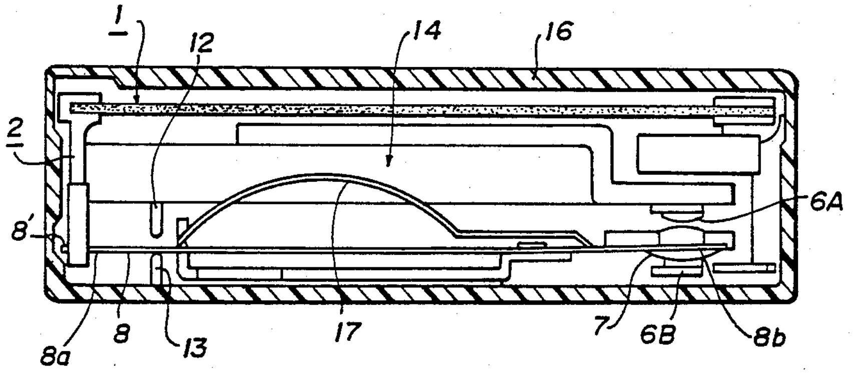
FIG. 2 shows in longitudinal sectional view the construction of a second preferred embodiment of the relay according to the present invention.
Figure 3:
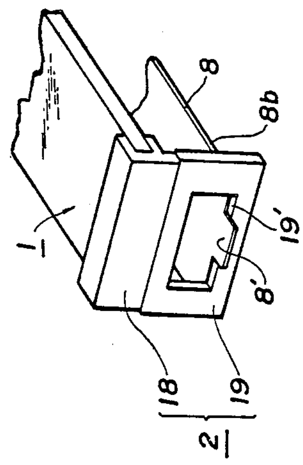
FIG. 3 is an enlarged perspective view of an actuating member comprised in said second preferred embodiment.

In FIG. 2 there is shown a longitudinal sectional view of a second preferred embodiment of the relay according to the present invention, and in FIG. 3 there is shown an enlarged detail of the actuating member 2 thereof. This relay is housed within a casing 16, in which the actuator 1, the actuating member 2, and the bistable switching mechanism 4 are received. In this construction, the part of the flip over lever 5 and the movable contact support member 8 in the first preferred embodiment described above is played by the movable contact support member 8, which is an elongated flexible member at the right hand tip end 8*a* of which in FIG. 2 there is fitted the movable contact 7, between the opposed fixed contacts 6A and 6B. A sheet spring 17 plays the part which was played in the first preferred embodiment described above by the tension coil spring 11, and stops 12 and 13, as before, are provided for limiting the motion of the left hand end 8*b* of the movable contact support member 8. Thereby, as will be understood by one of ordinary skill in the art based upon these discussions and in the light of the drawings, the over center flip flop action bistable switching mechanism 4 is constituted: when the left hand end 8*b* in FIG. 2 of the movable contact support member 8 is pressed downwards to the position shown in FIG. 2 against the stop 13, then said movable contact support member 8 and the sheet spring 17 snap into their shown positions in which the movable contact 7 is contacted to the fixed contact 6B and is removed from the other fixed contact 6A, and remain stably therein; but on the other hand when said left hand end 8*b* in FIG. 2 of the movable contact support member 8 is pressed upwards from the position shown in FIG. 2 to now contact the other stop 12, then said movable contact support member 8 and the sheet spring 17 snap from the shown position over into their other positions in which the movable contact 7 is contacted to the other fixed contact 6A and is removed from the fixed contact 6B, and similarly remain stably therein.

In this second preferred embodiment of the present invention, the construction is folded around from that of the first preferred embodiment, in order to save on longitudinal extent. In FIG. 3, there is shown a perspective view of the actuating member 2, to which the left hand end 8*b* in FIG. 2 of the movable contact support member 8 is directly coupled in this embodiment. This actuating member 2 is formed with a piece 18 into a groove of which the end of the actuator 1 is directly snugly fitted, and further has a frame shaped portion 19 formed with a rectangular hole 19' therein. A short projection 8' from the aforementioned left hand end 8*b* in FIG. 2 of the movable contact support member 8 is inserted into this rectangular hole 19'. Thereby, as will be understood by one of ordinary skill in the art based upon these discussions and in the light of the drawings, the short projection 8' and thereby the left hand end 8*b* of the movable contact support member 8 is coupled with regard to movement in its switching direction to the actuator 1, with a certain amount of play remaining therebetween as dictated by the vertical extent as seen in FIG. 3 of the rectangular hole 19' (which can be chosen freely during the design process of the relay). Thus the effect of this physical construction is similar to the effect of the construction shown in FIG. 1, and the same advantages are reaped thereby.

Figure 4:
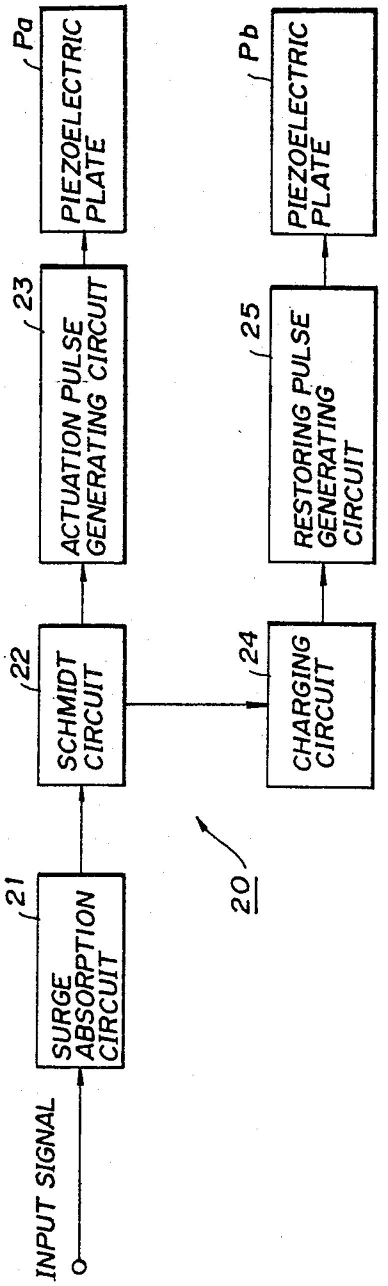
FIG. 4 is a block diagram of a possible construction for a drive circuit for the actuator of this relay.
Figure 5:
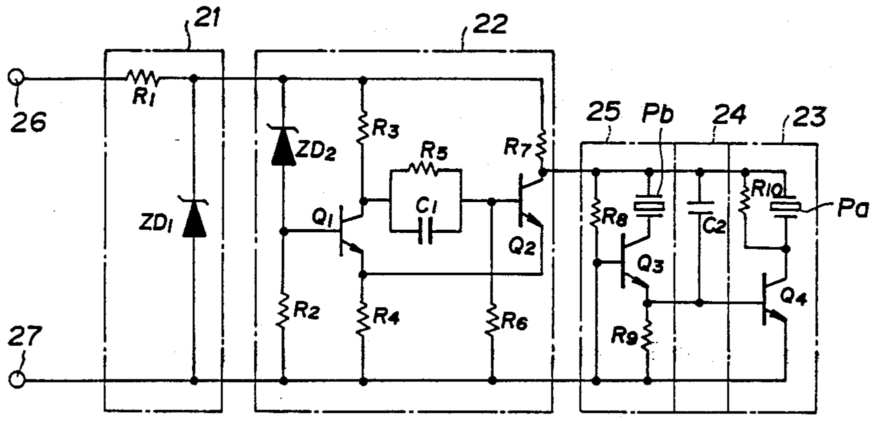
FIG. 5 is a detailed possible circuit diagram for said drive circuit.

In FIG. 4, there is shown a block diagram for a possible drive circuit 20 for the actuator 1 of this relay, and in FIG. 5 there is shown a detailed possible circuit diagram thereof.

Figure 7:
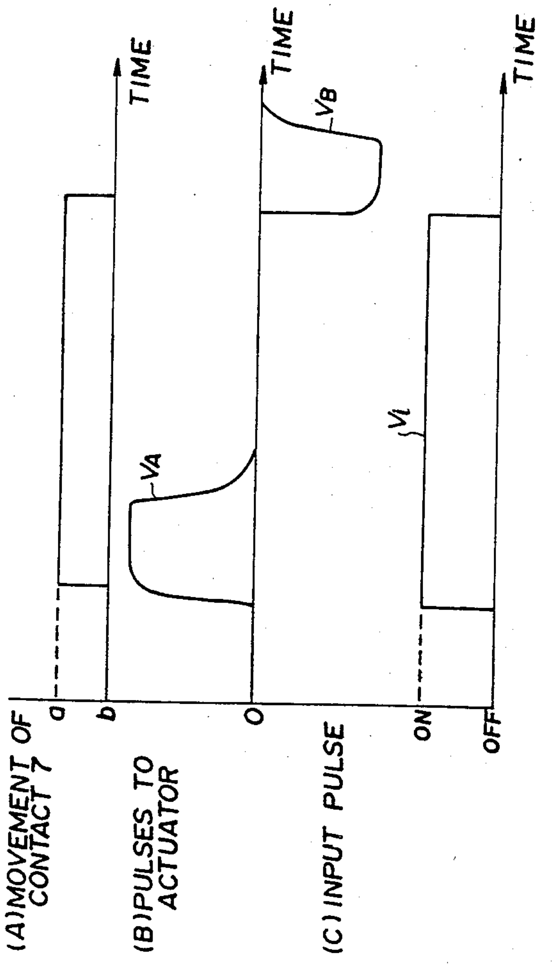
FIG. 7 is a timing chart showing certain exemplary signals relating to the drive circuit of FIGS. 4 through 6.

Referring to the block diagram of FIG. 4, the drive circuit 20 comprises a surge absorption circuit 21, a Schmidt circuit 22, an actuating pulse generating circuit 23, a charging circuit 24, and a restoring pulse generating circuit 25. When an input signal Vi, as schematically shown in the timing chart of FIG. 7*c*, starts to be supplied to the input of the surge absorption circuit 21, the actuating pulse generating circuit 23 supplies a one shot (or short duration) pulse VA, as schematically shown in the timing chart of FIG. 7*b*, to the one Pa of the piezoelectric plate elements making up the actuator 1, to switch the relay described above to its actuated state as explained above; and, on the other hand, when said input signal Vi ceases, the restoring pulse generating circuit 25 supplies a one shot pulse VB, as also schematically shown in the timing chart of FIG. 7*b*, to the other one Pb of the piezoelectric plate elements making up the actuator 1, to switch the relay described above to its restored state as also explained above. Thereby the movable contact 7 of the bistable switching mechanism 4 of the relay is driven for switchover in a reciprocating manner, as schematically shown in the timing chart of FIG. 7*a*.

Referring to FIG. 5, the surge absorption circuit 21 is a circuit for eliminating any external surge contained in the input signal Vi, and comprises an input restraining resistance R1 and a Zener diode ZD1 for surge absorption. The Schmidt circuit 22 is a circuit for detecting a certain signal level and for shaping the signal wave form, and comprises a pair of transistors Q1 and Q2 which undergo an ON/OFF action, a Zener diode ZD2 for setting up a threshold level, base resistors R2 and R6, load resistors R3 and R7, an emitter follower resistor R4, and a resistor R5 and a capacitor C1 which make up a speed up circuit. The actuating pulse generating circuit 23 is a circuit for supplying the one shot pulse VA for actuation to the one Pa of the piezoelectric plate elements of the actuator 1 and comprises a discharge resistor R10 in addition to a transistor Q4. The charging circuit 24 is a circuit for storing up electric charge in the capacitor C2 during the action of the actuation pulse generating circuit 23, and for supplying the stored up electric charge to the restoration pulse generating circuit 25 when the input signal Vi is disconnected. The restoration pulse generating circuit 25 is a circuit for supplying the voltage of the one shot pulse VB for restoration to the other one Pb of the piezoelectric plate elements of the actuator 1, and comprises a transistor Q3, a base resistor R8, and a bypass resistor R9.

In the above described circuitry, when the input signal Vi is applied to the input terminals 26 and 27, this signal is supplied to the Schmidt circuit 22 by way of the surge absorption circuit 21. When the input signal level is low, the transistor Q2 of the Schmidt circuit 22 is in the ON state, and therefore no input voltage is supplied to the pulse generating circuits 23 and 25 and the charge circuit 24.

Figure 6:
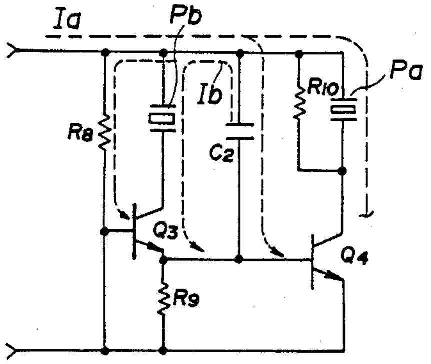
FIG. 6 is a detail of the circuit diagram of FIG. 5, showing the direction of certain current flows.

Then, when the input signal level has risen to a certain threshold level, since current flows through the base of the transistor Q1 by way of the Zener diode ZD2 in the Schmidt circuit 22, the base bias of the transistor Q2 is pulled down, thereby turning OFF the transistor Q2. As a result, an input signal voltage is supplied to the actuation pulse generating circuit 23 and to the charge circuit 24, and a current Ia as shown in the explanatory diagram of FIG. 6 flows and the charging current of the capacitor C2 flows through the base of the transistor Q4, thereby turning ON the transistor Q4 and driving the piezoelectric plate element Pa of the actuator 1. And, when the charging of the capacitor C2 is completed, the electric charge accumulated in the piezoelectric plate element Pa is discharged through the discharge resistor R10, whereby after the actuator 1 has bent it is restored back to its straight state. Thereby, as explained above, no problem of hysteresis arises for said actuator 1, and the stable operation of the relay, as well as a long service life therefor, are assured.

When the input signal level has declined below the threshold level, the transistor Q2 of the Schmidt circuit 22 turns ON, and the supply of the input signal voltage to the pulse circuits 23 and 25 and the charging circuit 24 is discontinued. Therefore, the electric charge of the capacitor C2 turns into the electric current Ib shown in FIG. 6, and this current flows through the base of the transistor Q3 by way of the base resistor R8 of the restoration pulse generating circuit 25. As a result, the transistor Q3 is turned ON, and the piezoelectric plate element Pb of the actuator 1 is driven, and this continues until the electric charge of the capacitor C2 disappears. Therefore, the actuator 1, after bending in the direction opposite to the one mentioned previously, is restored back to its straight state. Thus, again, as explained above, no problem of hysteresis arises for said actuator 1, and the stable operation of the relay, as well as a long service life therefor, are assured.

Although the present invention has been shown and described with reference to the preferred embodiments thereof, and in terms of the illustrative drawings, it should not be considered as limited thereby. Various possible modifications, omissions, and alterations could be conceived of by one skilled in the art to the form and the content of any particular embodiment, without departing from the scope of the present invention. Therefore it is desired that the scope of the present invention, and of the protection sought to be granted by Letters Patent, should be defined not by any of the perhaps purely fortuitous details of the shown preferred embodiments, or of the drawings, but solely by the scope of the appended claims, which follow.

What is claimed is:

1. A relay comprising:

(a) an actuator, comprising a pair of driving elements of a type which deflects according to applied voltage which are coupled together, said actuator deflecting in one direction when voltage is applied to the one of said driving elements and deflecting in another direction when voltage is applied to the other of said driving elements;

(b) a bistable switching mechanism comprising an actuating member and a set of contacts, said set of contacts being flipped over to a first state when said actuating member is impelled in a first direction and thereafter staying stably in said first state until said actuating member is impelled in a second direction, and being flipped over to a second state when said actuating member is impelled in said second direction and staying stably in said second state until said actuating member is impelled in said first direction; and:

(c) a drive circuit which upon command supplies a one shot pulse of relatively short duration to either said one of said driving elements or the other of said driving elements;

(d) said actuator being coupled to said actuating member of said bistable switching mechanism, so as when deflecting in said one direction to impel said actuating member in said first direction, and when deflecting in said another direction to impel said actuating member in said second direction.

2. A relay according to claim 1, wherein the coupling between said actuator and said actuating member of said bistable switching mechanism has a certain amount of play provided in it.

3. A relay according to claim 1, wherein said driving elements of said actuator are piezoelectric elements.

4. A relay according to claim 1, wherein said actuating member of said bistable switching mechanism is a snap over lever which flips over a flip over point for flipping over said set of contacts between said first state and said second state.

5. A relay according to claim 1, wherein said drive circuit comprises: an activation pulse generating circuit for generating a one shot pulse for activation; a restoration pulse generating circuit for generating a one shot pulse for restoration; and an electric charge circuit for charging electric charge and supplying the charged electric charge to the restoration pulse generating circuit when the activation pulse generating circuit is active.

* * * * *